United States Patent
Takahashi

(10) Patent No.: US 7,969,692 B2
(45) Date of Patent: Jun. 28, 2011

(54) MAGNETIC READING HEAD WITH FIRST AND SECOND ELEMENT UNITS EACH INCLUDING A FERROMAGNETIC LAYER AND EACH WITH A DIFFERENT SPIN-POLARIZATION

(75) Inventor: Hiromasa Takahashi, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 1003 days.

(21) Appl. No.: 11/740,300

(22) Filed: Apr. 26, 2007

(65) Prior Publication Data

US 2007/0253116 A1 Nov. 1, 2007

(30) Foreign Application Priority Data

Apr. 28, 2006 (JP) .................. 2006-126363

(51) Int. Cl.
*G11B 5/33* (2006.01)
*G11B 5/39* (2006.01)
(52) U.S. Cl. ........................................ 360/324
(58) Field of Classification Search .................. 360/324, 360/324.2
See application file for complete search history.

(56) References Cited

U.S. PATENT DOCUMENTS

| | | | |
|---|---|---|---|
| 5,206,590 A | 4/1993 | Dieny et al. | 324/252 |
| 5,862,022 A | 1/1999 | Noguchi et al. | 360/324.2 |
| 7,253,995 B2 | 8/2007 | Takahashi et al. | |
| 7,298,597 B2* | 11/2007 | Carey et al. | 360/324.2 |
| 7,349,186 B2* | 3/2008 | Ito | 360/324.2 |
| 7,522,392 B2* | 4/2009 | Carey et al. | 360/324.2 |
| 2004/0257714 A1 | 12/2004 | Takahashi et al. | 360/322 |
| 2005/0002128 A1* | 1/2005 | Ito et al. | 360/324.2 |
| 2005/0157434 A1* | 7/2005 | Ito | 360/324.2 |
| 2006/0056115 A1 | 3/2006 | Djayaprawira et al. | |

(Continued)

FOREIGN PATENT DOCUMENTS

JP 04-358310 12/1992

(Continued)

OTHER PUBLICATIONS

Office Action in Japanese Patent Appln. Ser. No. 2006-126363, dated May 18, 2010 (in Japanese) [3 pgs].

(Continued)

*Primary Examiner* — Julie Anne Watko
(74) *Attorney, Agent, or Firm* — Antonelli, Terry, Stout & Kraus, LLP.

(57) ABSTRACT

A magnetic head includes a pair of ferromagnetic electrodes, namely, a first ferromagnetic electrode layer which is in contact with a portion of a first electrode layer with a first insulating barrier layer interposed in between; and a second ferromagnetic electrode layer which is in contact with another portion of the first electrode layer with a second insulating barrier layer interposed in between. The first electrode layer and the first ferromagnetic layer collectively constitute part of a current-supplying circuit. Moreover, the first electrode layer and the second ferromagnetic layer which are in contact with the first electrode layer with the second insulating barrier layer interposed in between in a region where the two layers are not in contact with the first insulating barrier layer, collectively constitute part of a voltage-measurement circuit. Spin-polarization at the interface in an intersecting region of the second ferromagnetic layer and the second insulating barrier layer, is greater than spin-polarization at the interface in an intersecting region of the first ferromagnetic layer and the first insulating barrier layer.

4 Claims, 13 Drawing Sheets

II-II' CROSS SECTION

U.S. PATENT DOCUMENTS

2006/0262458 A1* 11/2006 Carey et al. ............... 360/324.2
2007/0253121 A1* 11/2007 Yamada et al. .......... 360/324.11
2010/0119875 A1* 5/2010 Sasaki ........................ 428/812

FOREIGN PATENT DOCUMENTS

| JP | 07-221363 | 8/1995 |
| --- | --- | --- |
| JP | 10-091925 | 4/1998 |
| JP | 2004-348850 | 12/2004 |
| JP | 2005135462 | 5/2005 |
| JP | 2006080116 | 3/2006 |

OTHER PUBLICATIONS

F. J. Jedema et al., "Electrical detection of spin precession in a metallic mesoscopic spin valve," Nature, vol. 416, pp. 713-316, Apr. 18, 2002.

L. Brataas, et al., "Spin Accumulation in Small Ferromagnetic Double-Barrier Junctions", Physical Review B, vol. 59, No. 1, pp. 93-97, Jan. 1999.

C. Heide, "Effects of Spin Accumulation in Magnetic Multilayers", Physical Review B, vol. 65, 054401, pp. 1-17, Dec. 2001.

* cited by examiner

FIG. 1A
FIG. 1B
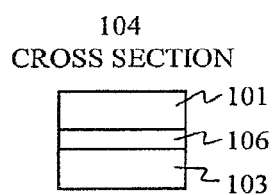
104
CROSS SECTION
FIG. 1C
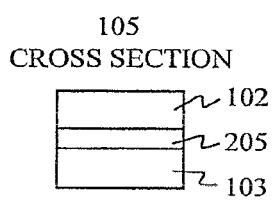
105
CROSS SECTION
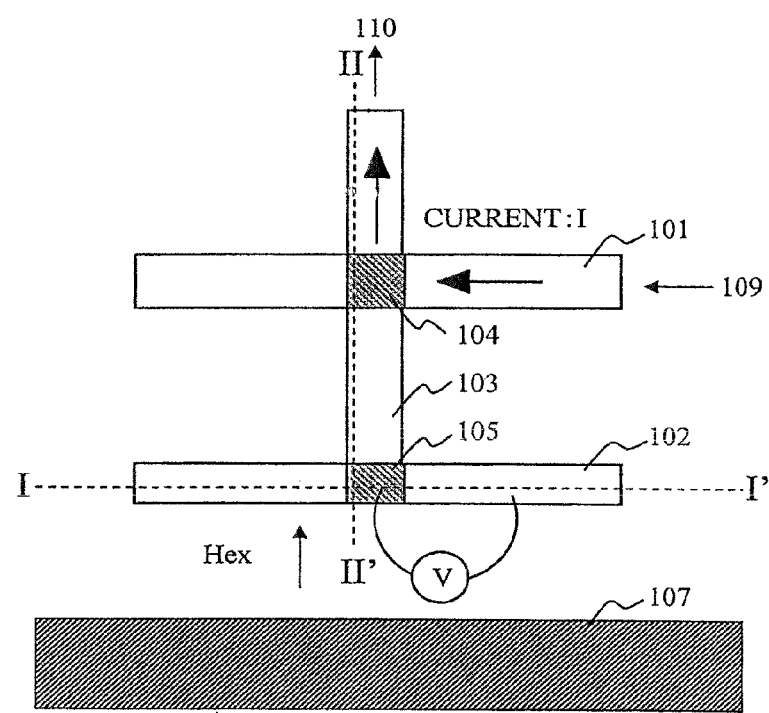
SPIN POLARIZATION AT 105
>SPIN POLARIZATION AT 104

II-II' CROSS SECTION

II-II' CROSS SECTION

I-I' CROSS SECTION (STRUCTURE DIAGRAM OF I-I' CROSS-SECTION)

(STRUCTURE DIAGRAM OF II-II' CROSS-SECTION)

(STRUCTURE DIAGRAM OF III-III' CROSS- SECTION)

ELEMENT HEIGHT DIRECTION

TRACK WIDTH DIRECTION

FILM THICKNESS DIRECTION

MAGNETIC READING HEAD WITH FIRST AND SECOND ELEMENT UNITS EACH INCLUDING A FERROMAGNETIC LAYER AND EACH WITH A DIFFERENT SPIN-POLARIZATION

CLAIM OF PRIORITY

The present application claims priority from Japanese application JP 2006-126363 filed on Apr. 28, 2006, the content of which is hereby incorporated by reference into this application.

BACKGROUND OF THE INVENTION

1. Field of the Invention

The present invention relates to a magnetic reading head including a magneto-resistive effect element.

2. Description of the Related Art

Magnetic recording and reading apparatuses face a demand for an increase in the areal recording density in a scale over 40% every year. Magnetic recording and reading heads provided in these magnetic recording and reading apparatuses also face a demand for higher performances in terms of both of recording and reading performances. Among these heads, it is important for the magnetic reading head to satisfy the following three technical issues of: (1) improvement in higher sensitivity; (2) improvement in the narrowing of a track width; and (3) improvement in the narrowing of a reading gap interval. So far, the demands for higher densities have been responded by means of an anisotropic magneto-resistive effect (AMR) for recording densities ranging from 1 to 10 Gb/in$^2$, or by means of a giant magneto-resistive effect (GMR) that can achieve higher sensitivity for recording densities ranging from 10 to 30 Gb/in$^2$. For recording densities ranging from 20 to 70 Gb/in$^2$, higher areal recording densities have been achieved by means of specular-GMR in which a highly electron-reflective (specular) insulative oxide layer or the like is interposed between boundary surfaces of a GMR structure so as to increase an output with a multiple-reflection effect of electron spin or by means of an advanced GMR effect called a nano-oxide layered GMR (NOL-GMR).

Concerning the magnetic head using the GMR, there are numerous disclosures for a structure called a spin valve as typically reported in Japanese Patent Application Laid-open No. 4(1992)-358310. This magnetic head basically includes three-layered films composed of a magnetic pinned layer, a non-magnetic thin film and a magnetic free layer. Specifically, the magnetic pinned layer is made of a magnetic body, and the magnetization thereof is fixed in a specific direction by use of an antiferromagnetic layer. The magnetic free layer is superposed on the magnetic pinned layer with the non-magnetic thin film interposed in between. The magnetic head includes a magneto-resistive effect element of which electric resistance changes with a relative angle of magnetization defined by the magnetic pinned layer and the magnetic free layer.

The pursuit of higher sensitivity requires even higher reading methods. A GMR method which utilizes an advantage of small element impedance to supply a detection current in a perpendicular direction to a film surface (this method is called CPP-GMR) is considered to be the mainstream for reading from a recording density range from 70 to 150 Gb/in$^2$, for example. A tunneling magneto-resistive effect (TMR) having an extremely high magneto-resistive ratio has an advantage in improving the sensitivity. A conventional basic MR technique using Al$_2$O$_3$ for an insulating barrier layer is disclosed in Japanese Patent Application Laid-open No. 10(1998)-91925 and the like. This film has the maximum magneto-resistive ratio of 70% which is higher than that of the CPP-GMR. However, it is difficult to put this film into practice because the magneto-resistive ratio rapidly drops when the resistance (impedance) of the film is reduced by decreasing the film thickness of the Al$_2$O$_3$ layer.

In a case of CIP-GMR, insulation between an element and a shield is a problem at the time when a shield-to-shield distance is reduced in order to cope with a higher linear recording density. On the other hand, such an insulation characteristic is not an important issue in a case of the CPP-GMR. Moreover, it is considered that problems such as element destruction by heat due to static voltage and current, and an effect of non-linearization due to a magnetic field, are also limited. Although there are numerous reports on the CPP-GMR, a typical example is disclosed in Japanese Patent Application Laid-open No. 7(1995)-221363.

Researches and device developments related to an interaction of spin-polarized currents are increasingly popular in recent years. For example, as disclosed in "Electrical detection of spin precession in a metallic mesoscopic spin valve," F. J. Jedema et al., NATURE, Vol. 416, pp. 713-316, 18 Apr., 2002, a phenomenon, in which a spin current with spin-polarization is transmitted for a long distance equal to or longer than 100 nm to cause a magnetic interaction, has been actually confirmed. Researchers for this study produced Co strips with mutually different thicknesses and an Al strip located perpendicular to the Co strips, and then formed a structure provided with alumina insulating barrier layers respectively positioned at intersections of each of the Co strips and the Al strip. In this event, when a magnetic field was applied to a film by applying a current from the thicker Co line to the Al line, an electric potential difference due to the magnetic field was generated between another Co line where the current is not applied and the Al line. In this way, a magnetic interaction was confirmed although an interval between the strips exceeded 500 nm. It is theoretically understood in such a form represented by Physical Review B, Vol. 59, No. 1, pp. 93-97 and Physical Review B, Vol. 65, 054401, pp. 1-17, for example, that this magnetic interaction is caused by spin polarized electrons, which are accumulated in interface portions of the AL strip, and which are thus distributed to a wide range of the strips.

In general, in a case where there are two magnetic bodies having different coercivities in an external magnetic field, this magneto-resistive effect element has characteristics that an outputted value of an electric potential of one of the magnetic bodies against a corresponding conductive body changes, and that this electric potential has a different polarity depending on the directions of the magnetization of the two magnetic bodies being parallel or anti-parallel to each other. In the above structure, the magnetic bodies are made of simple Co, and are connected together with Al. A changed output due to a change in the magnetic field is obtained at room temperature by use of this structure.

To achieve a reading sensor having a high output, it is considered to be effective (1) to increase the change in the electric potential from the viewpoint of the material composition, and (2) to amplify the change in the electric potential by means of the structure of the element. Concerning the factor (1), it is important to use a material with high spin-polarization for a material of the magnetic bodies. For a material of the conductive bodies, it is important to use Al, Cu or any other materials having a longer mean free path for the spin electrons than Al and Cu, or to use a material having a function as a d electron conductor. Concerning the factor (2), such a structure that a device is provided with a mechanism for amplifying a voltage signal is disclosed in Japanese Patent Application Laid-open No. 2004-348850.

Usually, it is conceivable that noises in a magnetic sensor include Johnson's noises due to heat, shot noise generated by the electrons tunneling through a barrier, and magnetic noises generated by the magnetization reversal tracked at a high frequency. The Johnson's noises are related to the element resistance, and have small values as well as a small dependency on the frequency. Accordingly, the Johnson's noises are basically common to any device, as white noises.

SUMMARY OF THE INVENTION

When considering a future structure of the magnetic reading element, the period in which the CIP-GMR is used has been extended due to the effect of the perpendicular magnetic recording method that has been put into practice in recent years. However, high-output magneto-resistive sensors adopting the CPP-GMR (Current-Perpendicular to Plane GMR) in which a current is applied in the direction of the film thickness or the TMR (Tunneling Magneto-Resistive effect) are promising in the future. Hence, the structure of the magnetic reading element is being shifted to one in which a sense current is applied with the CPP method.

In the CPP-GMR, a sensor is formed as a GMR structure, and a sense current is applied in the film-thickness direction of a thin film. Due to a shorter current path than that in the CIP-GMR, the resistance in a case of using a conventional GMR film is about $0.4\Omega$ for the element having the area of $0.25\ \mu m^2$, while $\Delta R/R$ is equal to 10% at the maximum. Since the value $\Delta R$ is approximately equal to $40\ m\Omega$, the CPP-GMR has a characteristic that the value $\Delta R$ is too small, as compared to the value of $2\Omega$ or more, which is defined as an output value required for applying the structure to the magnetic reading element. Moreover, in the conventional GMR film, a resistance change rate in the CPP direction is about several percent. Although it is possible to raise the resistance R and to increase the value $\Delta R$ by reducing the size of the element, the feasible element area is currently limited to be about $0.025\ \mu m^2$.

A TMR element is an element formed of a pair of magnetic bodies with an insulative barrier interposed in between, and has a structure in which a sense current is applied in the film thickness direction thereof. The TMR element has high resistance owing to the electric transmission through an insulating barrier layer. When the TMR element is formed to be a reading head or a magnetic field sensor, various noises are generated, and a signal-to-noise (S/N) ratio is thereby deteriorated. Researches for reducing the resistance are actively pursued to deal with this problem. When seeking to reduce the resistance in an insulating barrier layer using $Al_2O_3$ which is most commonly used today, it is difficult to make progress in reducing the resistance of this element since a decline in the output associated with reduction in the thickness of the $Al_2O_3$ film cannot be suppressed. Although a search for a new type of low-resistance TMR element using an insulating barrier layer mainly containing $Al_2O_3$ is in progress, a solution is yet to be found for overcoming the major problem that the element resistance is increased in inverse proportion to reduction in the element area. Accordingly, it is at present difficult to produce a reading head having a density area exceeding 500 $Gb/in^2$ by use of the TMR.

Considering the reading head having the density area equal to or above 500 $Gb/in^2$, it is necessary to use a material which is made of a substance having relatively low specific resistance, and with which the magneto-resistive change can be made larger since the element area is smaller. In addition, it is considered that new structure and method are required for improving the signal-to-noise ratio (SNR) at the time when operating an actual device.

In order to use a device, which utilizes the magnetic interaction of the spin-polarized currents, to a head, it is important to reduce noises in the device. The device utilizing the magnetic interaction of the spin-polarized currents basically includes the insulating barrier layer on a current path. Accordingly, the device is presumably under the influence of the shot noise, as similar to the case of the TMR. In particular, it is conceivable that a portion where the current directly flows acts as a noise source. The noise generation in this portion has a substantially proportional relationship with the spin-polarization, and thereby the noise generation increases when the polarization is high. In contrast, at a junction at a side where the voltage is generated (which is called a free layer), the noise is suppressed to zero in an ideal condition where: no current flows in a circuit; the spin-polarization is high; and the spin electrons are selectively transmitted completely. That is, it is important to achieve a design in consideration of the spin-polarization at a terminal interface in view of such a condition.

On the other hand, a TMR material which has a MgO crystalline barrier, and which is recently proved to have an enormous magneto-resistive ratio over 100%, is considered to be extremely important as a material for achieving such a spin accumulation device. The characteristics of this material are considered to be as follows. Specifically, (1) the enormous magneto-resistive ratio of the TMR material is exhibited at room temperature depending on a combination between the material and a magnetic material, (2) an energy level as the insulating barrier layer is characteristically low, and (3) the material has peculiar electric transmission feature which behaves as an insulating body in a state where magnetization is anti-parallel and substantially as metal in a state where magnetization is parallel, and thereby the feature contributes to a larger effect of noise reduction as compared to the conventional TMR material. By selecting an appropriate configuration and a material suitable for achieving the configuration, it is made possible to provide new structures respectively of a magnetic sensor and a magnetic reading head that can achieve higher outputs than the existing structures.

A magnetic reading head according to the present invention includes a first element unit which is formed by superposing a ferromagnetic layer on a conductive layer with an insulating barrier layer interposing in between, and in which the conductive layer and the ferromagnetic layer constitute part of a current-supplying circuit, and a second element unit which is formed by superposing a ferromagnetic layer on the conductive layer with an insulating barrier layer interposed in between, and in which the conductive layer and the ferromagnetic layer constitute part of a voltage-measurement circuit. Here, spin-polarization at an interface of a junction between the ferroelectric layer and the insulating barrier layer of the second element unit is greater than spin-polarization at an interface of a junction between the ferroelectric layer and the insulating barrier layer of the first element unit.

Another magnetic reading head according to the present invention includes a first element unit having a laminated film which is formed by superposing, on a conductive layer, a ferromagnetic layer made of CoFeB and having a fixed direction of magnetization with an insulating barrier layer made of MgO interposed in between, and in which the conductive layer and the ferromagnetic layer constitute part of a current-supplying circuit, and a second element unit having a laminated film formed by superposing, on the conductive layer, a ferromagnetic layer made of CoFeB and having a variable direction of magnetization depending on an external magnetic field with an insulating barrier layer made of MgO interposed in between, and in which the conductive layer and the ferromagnetic layer constitute part of a voltage-measurement circuit.

According to the present invention, it is possible to obtain a magnetic reading head which facilitates adjustment of element resistance, has an extremely high magneto-resistive ratio, and has a large output that is also effective for higher resolution, as compared to a conventional variable-type magneto-resistive magnetic reading head. A magnetic recording apparatus having a surface recording density exceeding 500 Gb/in$^2$ is obtained by mounting this magnetic reading head.

BRIEF DESCRIPTION OF THE DRAWINGS

FIGS. 1A, 1B and 1C are views showing a basic structure of an example of a magneto-resistive element according to the present invention.

DESCRIPTION OF THE PREFERRED EMBODIMENTS

Figure 2:
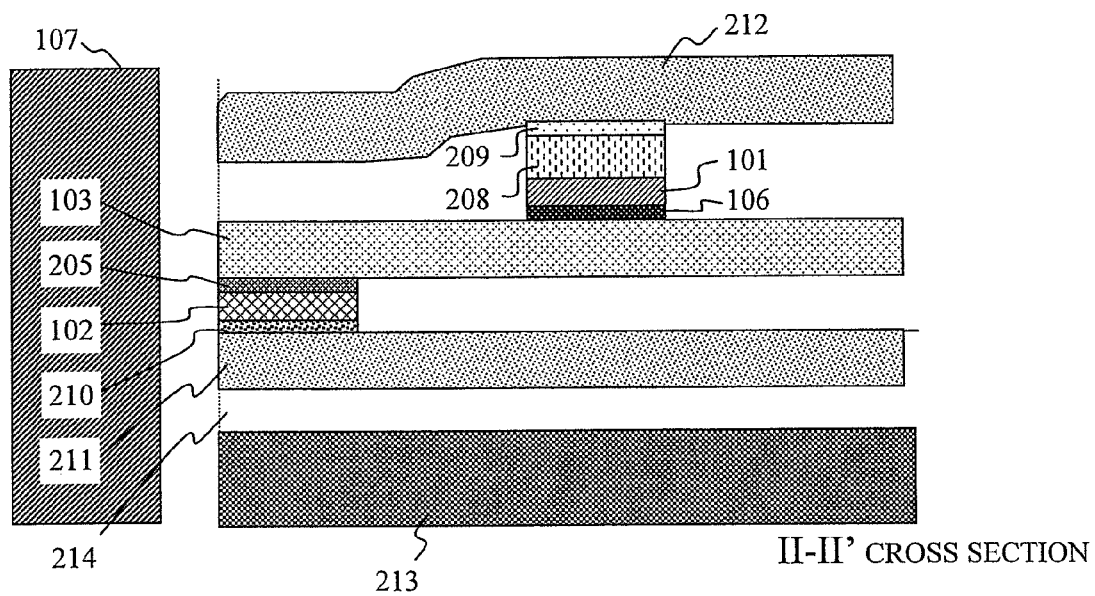
FIG. 2 is a schematic cross-sectional view showing a first embodiment of the magneto-resistive element according to the present invention.

A magnetic head suitable for adopting the present invention will be described below in detail.

As shown in FIGS. 1A, 1B and 1C, the most fundamental element structure of a magnetic head, to which the present invention is applied, is provided with a linear electrode layer 103 and a first magnetic body 101 which are connected to each other with a first insulating barrier layer 106 formed on this electrode layer 103. The magnetic head is also provided with a second magnetic body 102 which is located in a different position on this electrode layer 103, and which is connected to the electrode layer 103 via an insulating barrier layer 205. A current source for supplying a current is connected to each of the first magnetic body 101 and the electrode layer 103, and the current is caused to flow in a direction indicated with an arrow 109 and then in a direction indicated with an arrow 110. Moreover, the magnetic body 102 and the electrode layer 103 are connected to a voltage detecting circuit.

This structure generates magneto-resistive interaction in a distant place where spin information exceeds 500 nm. When the distance is shorter, the interaction is increased and an output signal is also increased exponentially. This phenomenon is caused because spin-polarized electrons are retained in the vicinity of an interface, and are thereby accumulated over a broad range in a non-magnetic body at the time when a current is supplied through the interface between the magnetic body and the non-magnetic body. Consequently, by providing magnetic functions such as those of a pinned layer and a free layer of normal spin valve films respectively to the magnetic bodies 101 and 102, it is possible to construct a structure which operates as a magnetic head.

Now, behaviors of the structure of the present invention and a mechanism for development of an effect thereof will be described. A magneto-resistive element utilizing the effect of spin-current accumulation converts a change in a magnetic field generated from a recording medium into a voltage-change signal, and thereby obtains the signal as an output. Basically, an antiferromagnetic layer is superposed on the pinned layer side to fix magnetization. In this way, a structure for increasing a coercive force is imparted by controlling magnetic shape anisotropy or magnetic crystal anisotropy by means of: fixing magnetization of the magnetic layer in one direction by an antiferromagnetic coupling force; changing dimensions of film thicknesses, line width, and the like; changing the material of the magnetic bodies; and the like. On the other hand, the free layer is basically made of a ferromagnetic layer. Here, the vicinity of the free layer is provided with a magnetic shielding mechanism for preventing an influence of an external magnetic field as appropriate together with a multilayer structure using multiple types of materials for retaining a magnetic single domain, a closed flux structure (CFS) in which a film functioning as a permanent magnet is formed by use of the non-magnetic film, and so forth.

FIG. 2, FIG. 3, FIG. 4, and FIG. 5 are schematic cross-sectional views for showing examples of relationship among a free layer, a pinned layer and a conductive layer. Each of these drawings shows a cross section taken along the line II-II' line in FIG. 1, and reference numeral 107 therein denotes a surface of a medium. An element is formed either directly on a substrate 213 or on a foundation layer 214 formed thereon. Reference numeral 211 denotes a film including a lower magnetic shield and an electrode (the electrode-cum-lower-shield), while reference numeral 212 denotes an electrode that also functions as an upper shield (the electrode-cum-upper-shield).

Figure 3:
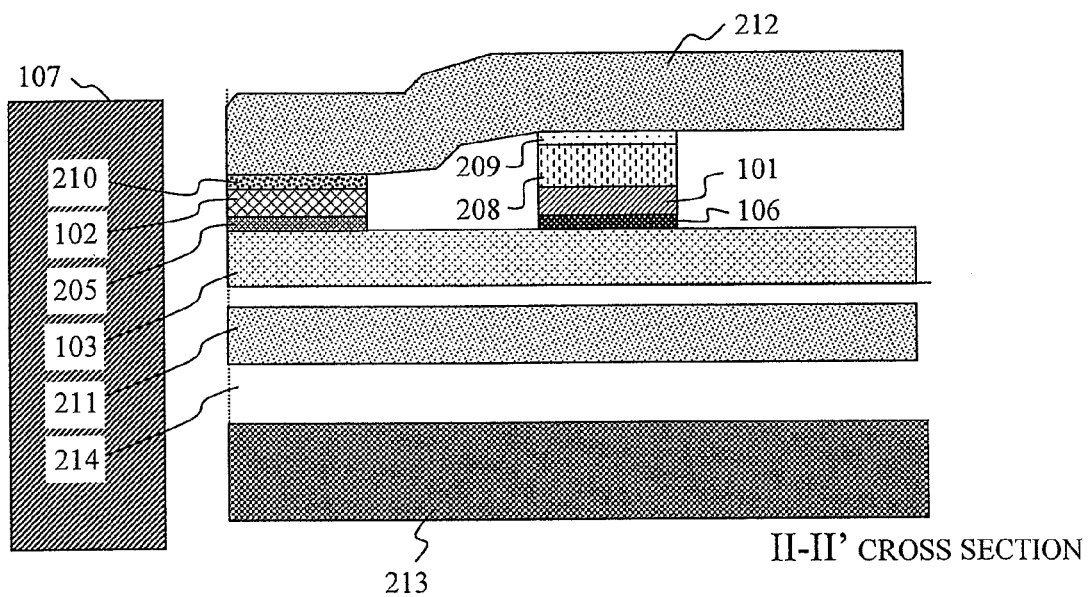
FIG. 3 is another schematic cross-sectional view showing a second embodiment of the magneto-resistive element according to the present invention.
Figure 4:
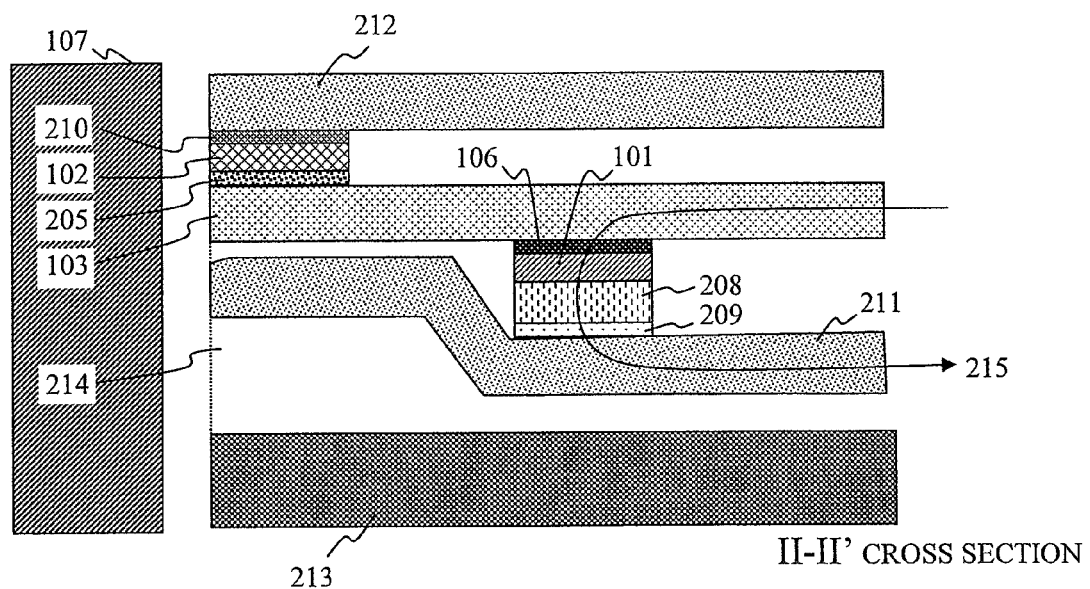
FIG. 4 is another schematic cross-sectional view showing a third embodiment of the magneto-resistive element according to the present invention.
Figure 5:
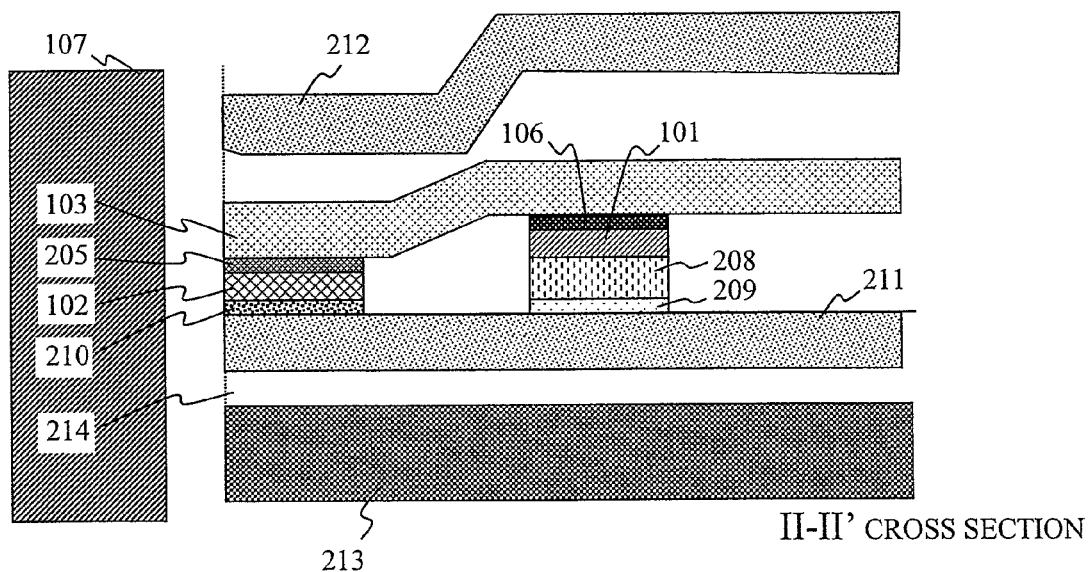
FIG. 5 is another schematic cross-sectional view showing a fourth embodiment of the magneto-resistive element according to the present invention.

If the pinned layer is located above the electrode layer 103 (FIG. 2 and FIG. 3) when the substrate 213 is placed at a lower side, the pinned layer is formed by sequentially depositing an insulating barrier layer 106, the magnetic layer 101, an antiferromagnetic layer 208, and a protecting film 209 on the electrode layer 103. As shown in FIG. 2, when the free layer is located below the electrode layer 103, a foundation film 210, the magnetic layer 102, an insulating barrier layer 205 and the electrode layer 103 are sequentially deposited on an upper surface of the electrode-cum-lower-shield 211. When forming the free layer on the electrode layer 103 as shown in FIG. 3, the insulating barrier layer 205, the magnetic layer 102, and the protecting film 210 are deposited in this order. The layers are formed in a similar manner in the examples in FIG. 4 and FIG. 5. Here, it is needless to say that the shape shown in FIG. 5, in which the electrode layer 103 is not arranged on a single plane is also effective. The antiferromagnetic layer 208 may be omitted when a difference in the coercive forces between the two magnetic layers 102 and 101 is sufficiently large. Meanwhile, spaces around the electrode layer are buried with insulative protecting films and the like.

Although the pinned layer appears to be in contact with the electrode-cum-upper-shield 212 in FIG. 3, the pinned layer is actually insulated from the electrode-cum-upper-shield 212, and a feed line is connected, from the side, to the antiferromagnetic layer 208. Similarly, although the pinned layer seems to contact the electrode-cum-lower-shield 211 in FIG. 5, the pinned layer is actually insulated from the electrode-cum-lower-shield 211, and a feed line is connected, from the side, to the antiferromagnetic layer 208.

To reduce noises in this device, an interface where voltage is detected, i.e., a magnetic material constituting the free layer and a material of the insulating barrier layer are made of material having the same or higher spin-polarization than those of an interface including a circuit for supplying the current, i.e., a magnetic material constituting the pinned layer and the material of the insulating barrier layer. When a factor $S_{NN}$ called a Spin Fano factor that is often used in the shot noise theory is derived for the above device, the total shot noise $S_{NN}$ on the supposition that the spin-polarization of the pinned layer (J1) is P(J1), and that the spin-polarization of the free layer (J2) is P(J2) is expressed by the following formula:

$$S_{NN} \propto P(J1) \times (1-P(J2)) \times I \quad (1)$$

where I is a sense current. This formula means that it is effective to set polarizability of the free layer to be equal to 1, or to minimize the spin-polarization of the pinned layer in order to reduce the shot noise. It is to be noted that an output ΔR is expressed by the following formula on the supposition that d is a distance between the two magnetic layers, and λ is a spin diffusion length. Since it is not possible to set P(J1) to be equal to zero, it is important to set the value of P(J2) as high as possible in order to increase the size of a signal, and to reduce noises. Accordingly, as shown in FIG. 1, a value of interface spin-polarization of a junction 105 needs to be greater than a value of interface spin-polarization of a junction 104.

$$\Delta R \propto P(J1) \times P(J2) \times I \exp(-d/\lambda) \quad (2)$$

Here, a characteristic required for the electrode layer 103 is a long spin diffusion length. To achieve this, it is considered effective to use a material either having extremely small resistance or a material having high conductivity for p electrons or d electrons. Hence, it is effective to use non-magnetic, and electrically-conductive metal such as Cu, Au, Ag, Pt, Al, Pd, Ru, C, Mg, Ir or Rh, or to use conductive non-magnetic compounds mainly containing any of GaAs, Si, TiN, TiO or ReO₃. A d-electron conductive compound which mainly contains any of TiN, TiO or ReO₃, and which has d electrons as magnetic electrons on a Fermi surface is considered to be particularly effective because such a compound can avoid dissipation of spin information associated with energy transition from the d electrons to s electrons. When using Cu, for example, the spin diffusion length is increased by reducing residual resistance of Cu. Ta (film thickness of 3 nm)/Cu (film thickness of 30 nm) which is formed on a $SiO_2$ substrate by a sputtering method in an ultrahigh vacuum, and which has the specific resistance in a range from 3 to 4 μΩcm has the spin diffusion length in a range from 300 to 500 nm. On the other hand, the above Ta/Cu having specific resistance equal to 2μΩcm has the spin diffusion length more than 700 nm. It is important to select a material with small resistance or an appropriate material, and to use a processing method of reducing the resistance as described above. The method of reducing the resistance includes a thermal treatment in a vacuum at a temperature in a range from 200° C. to 400° C.

Moreover, materials for forming the first and second magnetic films 101 and 102 may be metal such as Co, Ni, Fe or Mn, and alloys or compounds mainly containing at least one of the above elements. The conceivable materials include $Ni_{80}Fe_{20}$ or $Co_{90}Fe_{10}$ usually having a face-centered cubic (FCC) structure and favorable soft magnetic properties; alloys each having the composition ratio slightly deviated from the aforementioned alloys in the range of several percent, and the aforementioned alloys with additive element such as Cr, Ni or Co.

Here, as for the characteristic magnetic layers of the present invention, at least the magnetic layer on the free layer side is made of any of: an alloy film having a composition of a body-centered cubic (BCC) structure as represented by Fe or $CO_{50}Fe_{50}$; or a compound containing B (CoFeB) as well as a Co—Fe alloy of an amorphous structure; a film made of a compound containing a Co—Fe alloy and C, or containing a Co—Fe alloy and N (CoFeC); and a combination of these films subjected to a thermal treatment in a temperature ranging from 100° C. to not more than 400° C. In particular, it is important that the free layer made of these magnetic materials is in contact with the MgO insulating barrier layer.

As for the magnetic materials of the free layer to be coupled with the insulating barrier layer made of a designated insulating barrier layer material other than MgO, Heusler alloys such as CoFeCrAl or Spinnel compounds such as $Fe_3O_4$, all of which are magnetic materials showing significant half-metal behaviors, are used in addition to the above-described materials.

Moreover, it is preferable to use either a single-layer film or a laminated film made of a material containing at least one of $Al_2O_3$, AlN, $SiO_2$, $HfO_2$, $Zr_2O_3$, $Cr_2O_3$, MgO, $TiO_2$ and $SrTiO_3$ for the material forming the insulating barrier layers 106 and 205. In particular, as indicated previously, it is preferable to use crystalline MgO or crystalline $SrTiO_3$ in a region constituting the free layer depending on the kind of magnetic layer to be together used.

These materials are known to exhibit characteristic properties when formed in the TMR. It is possible to produce a film having a magneto-resistive change of 120% at room temperature by forming a NiFe layer in a thickness of 1 nm and a MnPt layer in a thickness of 13 nm on a Ta/Cu/Ta film, then forming a $(CoFe)_{60}B_{40}$ layer in a thickness of 3 nm as the magnetic layer, a MgO layer in a thickness of 1 nm, and a $(CoFe)_{60}B_{40}$ layer in a thickness of 3 nm as another magnetic layer by sputtering. Thereafter, the layers are subjected to a thermal treatment in a magnetic field adjusted to an external magnetic field of 6 kOe at a temperature of 270° C. It is also possible to produce a film having a magneto-resistive change higher than 200% at room temperature by optimizing various conditions for film deposition and element production.

The reason thereof is that MgO grown on the amorphous film exhibits the excellent (100) orientation, and that spin electron transmission of the BCC-type magnetic material via MgO forms an ideal spin device with extremely high spin-polarization. For example, when the magnetic bodies are made of a single material having the magneto-resistive effect of 100%, the spin-polarization simply becomes equal to 58%. In the present invention, the spin-polarization is basically shown with a result of measuring a TMR element of the specifications in which: a structure thereof is basically formed of three layers of the above-described conventional ferromagnetic layer A, insulating barrier layer and ferromagnetic layer B; the ferromagnetic layers A and B are made of the same material; one of the ferromagnetic layers is magnetically pinned with a antiferromagnetic layer; electrode layers are respectively provided to a substrate side of an element film and to an upper surface of the element film so that the current flows perpendicular to the film surface; the size of the element is in the range between 0.05×0.05 μm and 0.5×0.5 μm$^2$; and the shape of the element is substantially square to rectangular. In this case, a relationship between a resistance change rate and spin polarization at the interface is given by the following formula:

$$MR=100(R_{AP}-R_P)R_P=100 \cdot P_A P_B/(1-P_A P_B) \quad (3)$$

Here, $R_{AP}$ is the element resistance at the time when the directions of magnetization of the ferromagnetic layer A and the ferromagnetic layer B are antiferromagnetic, and $R_P$ is the element resistance at the time when the above magnetization is in a parallel state. $P_A$ and $P_B$ respectively indicate the spin-polarization of the ferromagnetic layer A and the ferromagnetic layer B against the insulating barrier layer. In general, in a case where a magneto-resistive change rate is equal to 100% in the TMR that uses the same magnetic body, the spin-polarization at the interface is approximately equal to 58%. Currently, in consideration of an effective noise reduction effect as shown below, and of achieving this effect, it is effective to use either a tunneling barrier device such as a MgO barrier or a half-metal device. The characteristics of these devices are experimentally obtained as a TMR change rate in a range from 80% to 100% or above. With this TMR change rate being converted into a numerical value, the TMR change rate is equivalent to the effective spin polarization at the interface equal to or above 58%.

Figure 6:
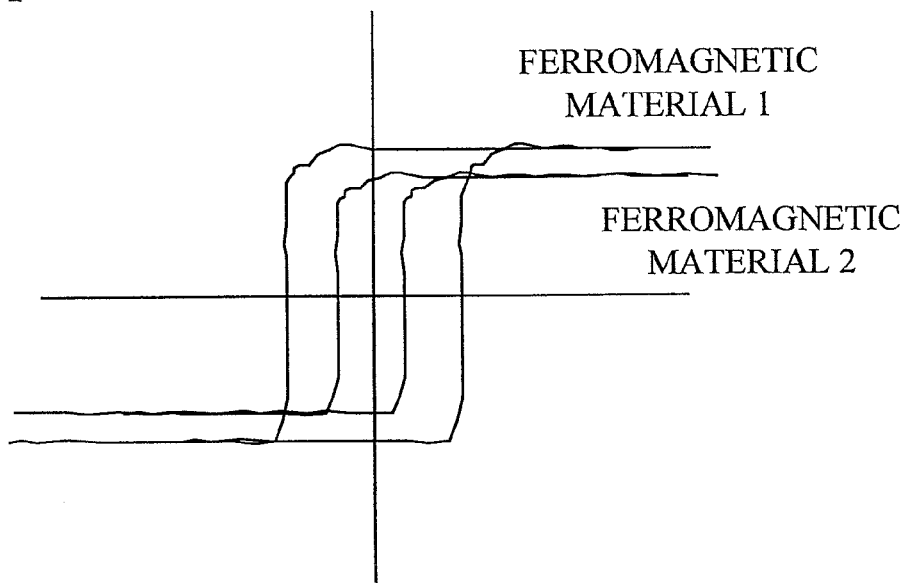
FIGS. 6A and 6B are graphs respectively showing a magnetic characteristic and a magnetic-field dependency of a voltage-change signal output of the magneto-resistive element according to the present invention.
Figure 6:
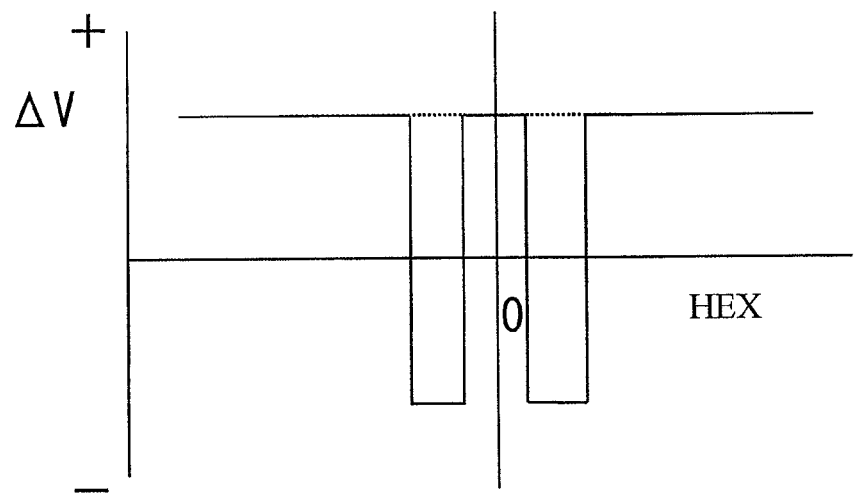

Now, the structure for reducing noises will be considered. When the insulating barrier layers 106 and 205 are both made of Al$_2$O$_3$ thin films having a film thickness of 1.2 nm, a current is supplied from the ferromagnetic strip 101 made of Co to the Cu strip 103, and thereby a magnetic field H is applied to the entire element. At this time, the magnetic strips have different coercive forces due to differences in the thickness and the material of each strip. Accordingly, as shown in FIG. 6A, the magnetic body 1 (101) and the magnetic body 2 (102) have magnetization curves of mutually different shapes. When an electric potential difference ΔV generated between the magnetic strip 102 made of Co75Fe25 and the Cu strip 103 is measured at the junction 105, for example, the polarization of the electric potential difference ΔV is inverted at the time when magnetization caused by a difference in the coercive force is in the anti-parallel state, as show in FIG. 6B. This change can be confirmed at room temperature even if the distance between the magnetic strips 101 and 102 is about as long as 500 nm. In the above-described example, the insulating barrier layers on the pinned layer and on the free layer are made of the same material, and $CO_{75}Fe_{25}$ (P=0.45) is used as the material of the magnetic layer on the free layer side. In this case, the noises are reduced by nearly 50% as compared to a conventional device made of Co (P=0.3). These phenomena are related to the increase in the output as shown in Table 1.

TABLE 1

| Magnetic layer 1 (Pin) | Co | Co$_{75}$Fe$_{25}$ | Co | Co$_{75}$Fe$_{25}$ | Co | Co | CoFeB |
|---|---|---|---|---|---|---|---|
| Insulating barrier layer 1 | Al$_2$O$_3$ | Al$_2$O$_3$ | Al$_2$O$_3$ | Al$_2$O$_3$ | Al$_2$O$_3$ | Al$_2$O$_3$ | MgO |
| Magnetic layer 2 (Free) | Co | Co$_{75}$Fe$_{25}$ | Co$_{75}$Fe$_{25}$ | Co | Fe | CoFeB | CoFeB |
| Insulating barrier layer 2 | Al$_2$O$_3$ | Al$_2$O$_3$ | Al$_2$O$_3$ | Al$_2$O$_3$ | MgO | MgO | MgO |
| Nonmagnetic layer | Cu | Cu | Cu | Cu | Cu | Cu | Al |
| P1 | 0.3 | 0.45 | 0.3 | 0.45 | 0.3 | 0.3 | 0.75 |
| P2 | 0.3 | 0.45 | 0.45 | 0.3 | 0.6 | 0.75 | 0.75 |
| Vp@1 mA | 0.6 mV | 1.0 mV | 1.1 mV | 0.6 mV | 3.0 mV | 5.2 mV | 6.1 mV |

Distance between two magnetic strips: 300 nm

On the other hand, it is also possible to increase polarizability of the spin-polarized current, and thereby to reduce the noises by using a material having high spin-polarization such as a half-metal to part of the magnetic body on the free layer side. Here, the half-metal is a substance in which nearly 100% of electron structures on a Fermi surface of the half-metal material are aligned in one spin orientation out of a spin-up orientation and a spin-down orientation. The polarizability P is defined as a bias of this spin orientation. With the number of spin-up electrons on the Fermi surface indicated as n↑. and with the number of spin-down electrons thereon indicated as n↓, the polarizability P is defined by the following formula:

$$P=100\times(n\uparrow-n\downarrow)/(n\uparrow+n\downarrow) \quad (4)$$

When electrons are supplied to the half-metal, the electrons having the same spin components as the orientation of the electron spin on the Fermi surface of the half-metal are preserved and transmitted inside the half-metal. On the contrary, the electrons having the opposite orientation cannot be transmitted due to a repulsive force.

When the magnetic layer 102 made of a half-metal is put into at least free layer side of the magnetic layer in a structure of the magnetic field sensor shown in FIG. 1, the spin-polarization of the electrons passing through the half-metal layer is extremely high. In a case of an ideal half-metal, nearly 100% of the electrons on the Fermi surface are spin-polarized. Hence, the current passing therethrough has the spin-polarization close to 100%. The actual known polarizability of a half-metal at room temperature ranges from 50% to 90%. This is attributable to the fact that the resistance of the half-metal against the current having the spin component in the opposite orientation is almost infinitely large, and thereby the electrons in the opposite spin orientation are scattered and only the spins in one orientation are transmitted while retaining a large scattering length.

The polarizability of the spin electrons accumulated in the electrode layer is increased by effectively infusing the highly spin-polarized current from the above-described magnetic layer to the electrode layer, and thereby the magnetic interaction is enhanced while the noises are suppressed to a low level. Accordingly, the magnitude of the magnetic field-dependent electric potential difference ΔV generated on the free layer side is made extremely large.

The film for forming the antiferromagnetic layer 208 may be made of PtMn, CrMnPt, MnIr, NiO, PdPtMn, and the like. Sufficiently large unidirectional anisotropy is developed when any of these materials is formed in a thickness in a range from several nanometers to several tens of nanometers which is equal to or above a critical film thickness defined for each composition, and when the film is subjected to a thermal treatment in a magnetic field under proper conditions. Accordingly, any of these materials is effective for fixing the magnetization of the first magnetic film 101 at the junction.

Figure 7:
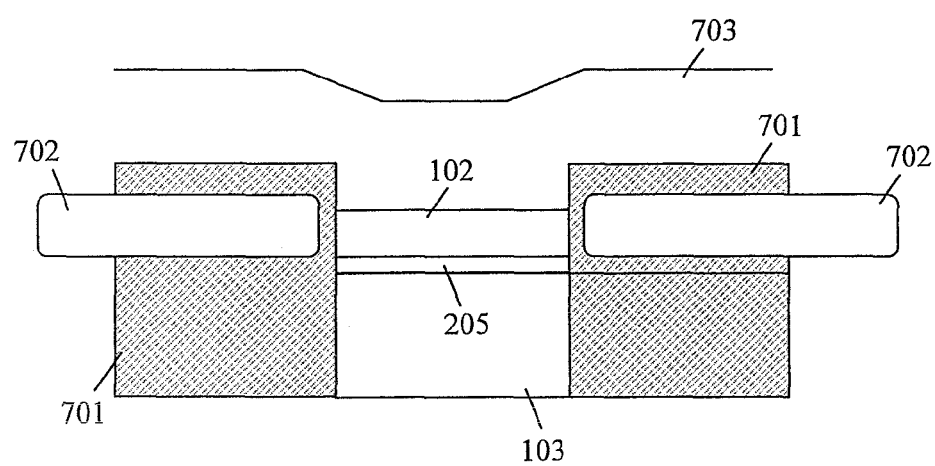
FIG. 7 is a cross-sectional view showing a region around a magnetic layer having a hard-bias magnetic-domain control structure.

Concerning magnetic domain control in the free layer 102, suppose a case of considering application of a hard-bias mode which is used in conventional GMR reading heads as illustrated in a cross section in FIG. 7 taken along the I-I' line shown in FIG. 1. In this case, by disposing permanent magnets 702 used for the hard bias respectively in both end portions in a track width direction of the element film 102, it is possible to reduce minute magnetic domains generated in the end portions of the free layer 102 in the element by use of leakage magnetic flux from the permanent magnets 702. Thereby, it is possible to form a magnetic domain structure which is aligned in one direction.

Moreover, by forming such a configuration that the magnetization of one of the magnetic body out of the two magnetic bodies is fixed to a specific direction while the magnetization of the other magnetic body is inverted by the external magnetic field, achieving the states where the directions of the magnetization respectively of both of the magnetic bodies are parallel and anti-parallel to each other, the magnetic body with the fixed magnetization functions as the pinned layer in the spin valve structure while the other magnetic layer functions as the free layer. In fact, the magnetic film with the fixed magnetization in the above-described structure can be achieved by a method of fixing the magnetization by means of exchange coupling due to the unidirectional anisotropy of the antiferromagnetic body, or by a method of adjusting the film thickness and the material in a way that a coercive force higher than that of the magnetic body on the free layer side is achieved.

Furthermore, another new method of magnetic domain control is that in which a permanent magnet is attached to the free layer 102, or is attached to the free layer 102 and to a principal surface of the insulating barrier layer 205 being in contact with the free layer 102 respectively via non-magnetic films. In addition, it is also effective to use a method (a closed flux structure method or a CFS method) for forming a multilayer film which is made of a soft magnetic film attached to an antiferromagnetic film, thereby aligning the magnetic domain of the free layer 102 by use of leakage magnetic flux generated from the permanent magnets or from end portions of the soft magnetic film. In a region where the size of the element is below 1 μm$^2$, it is expected that an insulation property of the hard-bias insulating film and accuracy of a magnetic-domain-controlling magnetic field are significantly deteriorated. Although reducing the film thickness is an issue for a region where a gap interval is less than 50 nm, this method is promising in the future, and is sufficiently effective for the film structure of the present invention.

Figure 8:
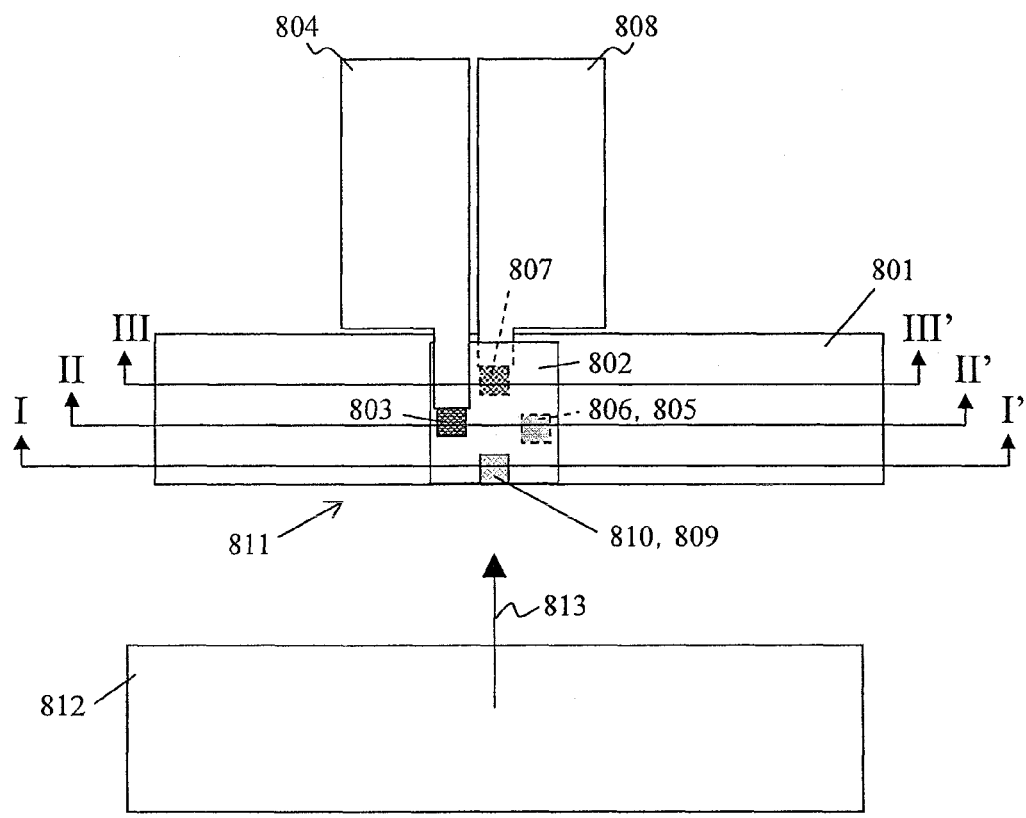
FIG. 8 is a view showing a basic structure of another example of the magneto-resistive element according to the present invention.
Figure 9:
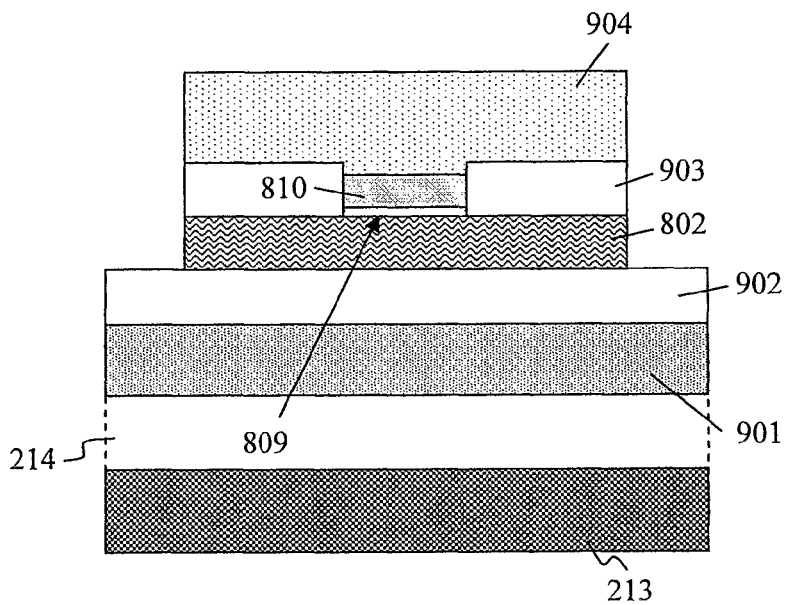
FIG. 9 is a schematic cross-sectional view of the device shown in FIG. 8.
Figure 10:
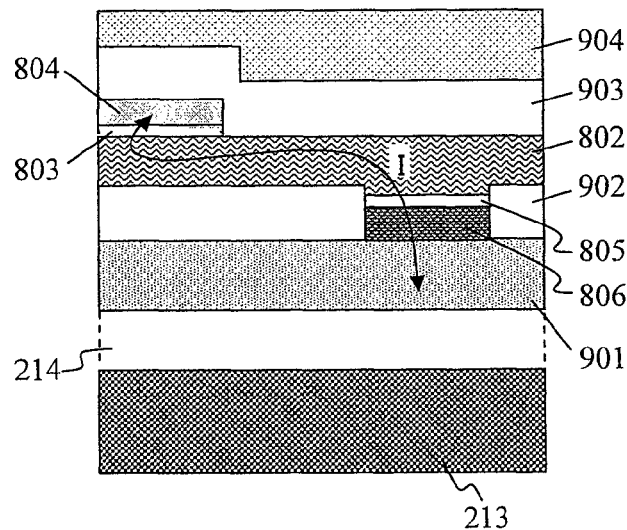
FIG. 10 is another schematic cross-sectional view of the device shown in FIG. 8.
Figure 11:
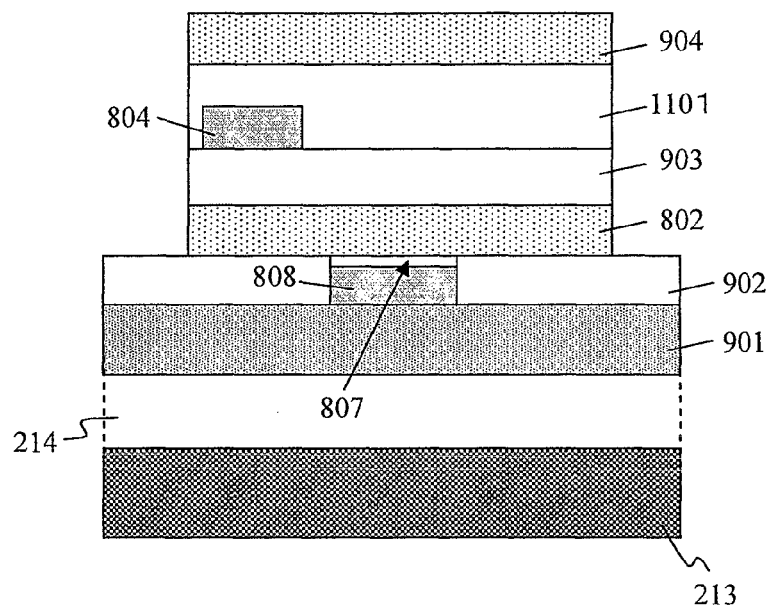
FIG. 11 is another schematic cross-sectional view of the device shown in FIG. 8.

FIG. 8 is a schematic diagram of another magnetic reading head to which the present invention is to be adopted, as viewed from above an element film of the magnetic reading head. Meanwhile, FIG. 9 is a cross-sectional view taken along the I-I' line in FIG. 8, FIG. 10 is a cross-sectional view taken along the II-II' line in FIG. 8, and FIG. 11 is a cross-sectional view taken along the III-III' line in FIG. 8.

This magnetic reading head includes a base 801 which is formed of a substrate, a foundation material and the like; a first electrode layer 802; and first, second, third and fourth ferromagnetic electrode layers 804, 806, 808 and 810 disposed on an upper or lower surface of the first electrode layer 802 respectively via first, second, third and fourth insulating barrier layers 803, 805, 807 and 809 which are in contact with the first electrode layer 802. The fourth ferromagnetic electrode layer 810 is disposed in a position close to a surface 811 which is opposed to a surface of a medium. The fourth ferromagnetic electrode layer 810 is either exposed on the surface 811 that is opposed to the surface of the medium 812, or is formed via a protecting film or the like. The magnetic reading head further includes a magnetic shielding structure around the sensor such that a magnetic field 813 from the medium is applied at least to the fourth ferromagnetic electrode layer 810.

In this structure, the first and third ferromagnetic electrode layers 804 and 808 have electrode terminal structures outside the first electrode layer 802, for example. Meanwhile, the fourth and second ferromagnetic electrode layers 810 and 806 have either magnetic shielding layers respectively disposed above and below these ferromagnetic electrode layers or structures which are in contact with low-resistance electrode layers that are in contact with the magnetic shielding layers (reference numeral 901 or 904 in FIG. 9, FIG. 10 and FIG. 11). For example, the structure is configured to measure a voltage between the third ferromagnetic electrode layer 808 and the fourth ferromagnetic electrode layer 810 (collectively referred to as a second ferromagnetic electrode pair) as an output signal at the time when the current is supplied from the first ferromagnetic electrode layer 804 to the second ferromagnetic electrode layer 806 (collectively referred to as a first ferromagnetic electrode pair). Accordingly, concerning the coercive forces of the fourth magnetic electrode layer, the third magnetic electrode layer, and other electrode layers, the coercive force of the fourth magnetic electrode layer is set to be the smallest value, and thereby at least the direction of magnetization of the fourth magnetic electrode layer is rendered variable by the outside magnetic field.

As similar to the previous description, it is also possible to reduce the noises in this case if this structure has the same configuration of the spin polarization at the interface as the configuration of the foregoing structure, in which the fourth magnetic electrode layer is defined as the free layer while the other layer is defined as the pinned layer. To reduce the noises in this device, the interface for performing voltage detection, i.e., the magnetic material constituting the free layer and the material of the insulating barrier layer are made of a material having higher spin-polarization than those of the interface including the circuit for supplying the current, i.e., a magnetic material constituting the pinned layer and the material of the insulating barrier layer. As similar to the previous description, when the factor $S_{NN}$ called the Spin Fano factor is derived for this device, the total shot noise $S_{NN}$, on the supposition that the spin-polarization of the pinned layer (J1, J2, J3) is P(J1, J2, J3) while the spin-polarization of the free layer (J4) is P(J4), is expressed by the following formula:

$$S_{NN} \propto P(J1)P(J2) \times ((P(J4)-P(J3)) \times I \quad (5)$$

where I is the sense current. This formula indicates that it is effective to reduce the polarizability P(J1) and the polarizability P(J2) of the pinned layers, and to approximate the value of the spin-polarization of the pinned layer J3 to the value of the spin-polarization of the free layer J4 in order to reduce the shot noise. It is to be noted that the output ΔR is expressed by the following formula on the supposition that d is the distance between the two magnetic layers, and λ is the spin diffusion length.

$$\Delta R \propto P(J1) \times P(J2) \times P(J4) \times P(J3) \times I \exp(-d/\lambda) \quad (6)$$

Consequently, it is not possible to set the value of P(J1)×P(J2) to be equal to zero. Apparently, it is important to set the value of P(J4)×P(J3) as high as possible in order to increase the size of a signal, and to reduce the noises in this device. Accordingly, as shown in FIG. 8, a value of spin polarization at the interface of a junction 810 needs to be greater than a value of spin polarization at the interface of a junction 808.

As similar to the above description, it is also possible to reduce the noises in this case if this structure has the same configuration of the spin polarization at the interface as the configuration of the foregoing structure, in which the fourth magnetic electrode layer is defined as the free layer while the other layer is defined as the pinned layer. To reduce the noises in this device, the interface for performing voltage detection, i.e., the magnetic material constituting the free layer and the material of the insulating barrier layer are made of a material having higher spin-polarization than those of the interface including the circuit for supplying the current, i.e., a magnetic material constituting the pinned layer and the material of the insulating barrier layer. As similar to the previous description, when the factor $S_{NN}$ called the Spin Fano factor is derived for this device, the total shot noise $S_{NN}$ on the supposition that the spin-polarization of the pinned layer (J1, J2, J3) is P(J1, J2, J3) while the spin-polarization of the free layer (J4) is P(J4), is expressed by the following formula:

$$S_{NN} \propto P(J1)P(J2) \times ((P(J4)-P(J3)) \times I \quad (7)$$

where I is the sense current. This formula indicates that it is effective to reduce the polarizability P(J1) and the polarizability P(J2) of the pinned layers, and to approximate the value of the spin-polarization of the pinned layer J3 to the value of the spin-polarization of the free layer J4 in order to reduce the shot noise. It is to be noted, however, that the output ΔR is expressed by the following formula on the supposition that d is the distance between the two magnetic layers, and λ is the spin diffusion length.

$$\Delta R \propto P(J1) \times P(J2) \times P(J4) \times P(J3) \times I \exp(-d/\lambda) \quad (8)$$

Consequently, it is not possible to set the value of P(J1)×P(J2) equal to zero. Apparently, it is important to set the value of P(J4)×P(J3) as high as possible in order to increase the size of a signal, and to reduce the noises in this device. Accordingly, as shown in FIG. 8, this structure has a characteristic condition that the noises are reduced if the value of spin polarization at the interface of the junction 810 is equivalent to the value of spin polarization at the interface of the junction 808.

Now, a method of manufacturing a magnetic reading head of the present invention will be described below.

The multilayered films as observed in the cross section of the element in FIG. 2 is deposited on the conventionally-used substrate 213 such as $SiO_2$ substrate or a glass substrate (which may also be made of a magnesium oxide substrate, a GaAs substrate, an AlTiC substrate, a SiC substrate, an $Al_2O_3$ substrate or the like) by use of a film forming apparatus which uses a method such as a high vacuum sputtering method and a molecular beam epitaxy (MBE) method. In a case of using a RF sputtering method, for example, the films are deposited in an Ar atmosphere with gas pressure in a range from about 1 to 0.05 Pa, and with power in a range from 50 W to 500 W. For the base for forming the element, the substrate 213 is used directly, or with an insulating film, an appropriate foundation metal film 214, and the like, being formed on the substrate 213.

The film 211 including the lower magnetic shield and the electrode is formed on the substrate 213 or 214 on which the element is to be formed, and the Ta film 210 (film thickness of 3 nm) and the CoFeB film 102 (film thickness of 20 nm) are sequentially formed thereon in an ultrahigh vacuum equal to or below 10-9 Torr. Then, the MgO film is formed thereon in the film thickness of 1 nm. Thereafter, the Cu film 103 is formed thereon, and then the protective film is provided. The MgO film functioning as the insulating barrier layer is directly deposited. The barrier or insulating film can also be formed similarly with ZnO or SrTiO. In a case of an alumina insulating barrier layer, an Al film may be deposited, and then be subjected to oxidation. Other oxidation processes such as plasma oxidation or ozone oxidation may be similarly used in this event, instead of natural oxidation. A resist is coated on this film, and a magnetic strip form (the free layer) 105 is drawn thereon by lithography using an i-line stepper or an electron beam. In the drawing process, the i-line stepper has difficulty in drawing for the fine strip of several hundreds of nanometers or of a shorter length. In this case, the form is drawn by an electron-beam drawing method. This film is subjected to a milling process by use of an Ar-ion milling apparatus, and thereby is formed into a pattern.

After cleaning the surface including this strip, the Cu film and then the MgO or $Al_2O_3$ film 106 are sequentially formed on the cleaned surface. Thereafter, the CoFeB magnetic layer 101 is formed thereon, and then the protective film is provided. Subsequently, after producing a strip portion, and then grinding the magnetic layer off the strip portion, the CoFeB magnetic layer, the MnIr layer functioning as the antiferromagnetic film 208, and the protective film 209 are sequentially formed thereon. Then, after forming the second magnetic strip portion (the pinned layer) 104 is formed thereon, the magnetic layer of the strip portion is completely ground off. The electron-beam drawing method, the stepper method or a probe drawing method is used for producing the films. When forming the hard bias film for the free layer, a CoCrPtZr film functioning as a permanent magnet is formed after deposition of an insulating film, and then another insulating film is formed thereon. Subsequently, a drawing process is carried out for forming a Co line. After cleaning the surface, the soft magnetic film made of a material such as Co or NiFe, and the antiferromagnetic film made of a material such as MnIr are deposited. Although the multilayered film shown in FIGS. 3, 4 and 5 each have a positional relationship between the non-magnetic strips and the magnetic film which is different from the above-described configuration, these films can be produced similarly. Note that reference numeral 212 denotes the electrode-cum-upper-shield.

Figure 13:
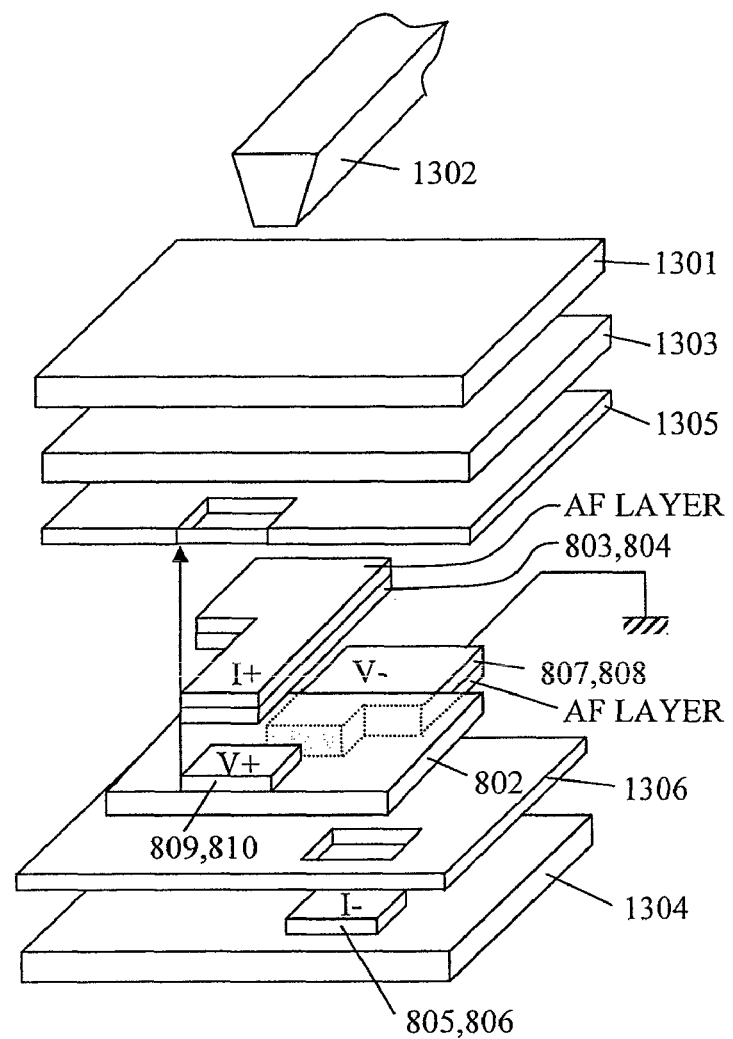
FIG. 13 is a view showing another structural example of the magnetic reading head according to the present invention.
Figure 13:
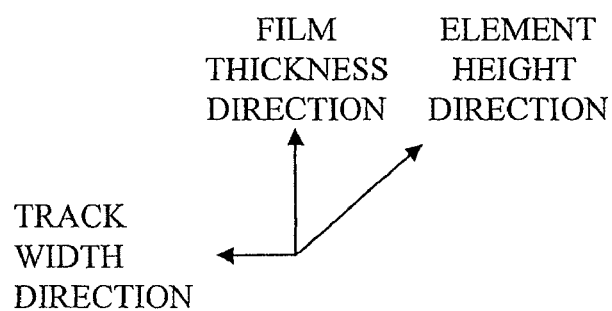

The film shown in FIG. 13 is based on similar apparatus settings to those in the first embodiment. For the purpose of simplicity, after forming a lower shielding film 1304, in a high vacuum, on the substrate on which the element is to be formed, the magnetic film 805 and the MgO insulating film 806 are formed thereon, and then a pattern is produced. Thereafter, an insulating film 1306 is formed, and then the magnetic film 808 and the barrier film 807 are formed thereon. Thereby, a pattern is produced. Furthermore, the Al film 802 is formed in the film thickness of 10 nm, and then the battier film 809, an antiferromagnetic film AF, and the magnetic film 810 are formed thereon. Then, the form of the first electrode layer 805 is drawn by the electron-beam drawing method, and thereafter the layer is formed by milling. Moreover, the insulating barrier layer 803, the magnetic layer 804, and the antiferromagnetic film AF are produced, and thereby an electrode pattern is formed. An insulating film 1305 made of $Al_2O_3$ or $SiO_2$ is formed thereon, and then the form is drawn by the lithography and by the electron-beam drawing method. Thereafter, the junction is formed. Here, an insulating film made of $Al_2O_3$ or $SiO_2$ is formed in a peripheral portion of the junction by use of a lift-off pattern utilizing a two-stage resist or the like, and then a lift-off process is executed. The electron-beam drawing method, the stepper method or the probe drawing method is used for forming the films. In addition, a process is performed for removing burrs which is generated after an ion-milling process or a dry etching process. When producing the hard-bias film for the free layer, a film made of a material such as CoCrPtZr functioning as a permanent magnet is deposited after forming an insulating film, and then another insulating film is formed thereon. Subsequently, a drawing process is executed for forming the ferromagnetic electrode. After cleaning the surface, an electrode film 1303, a shielding film 1301 and a mechanism 1302 corresponding to a writing head are formed on the cleaned surface.

Figure 14:
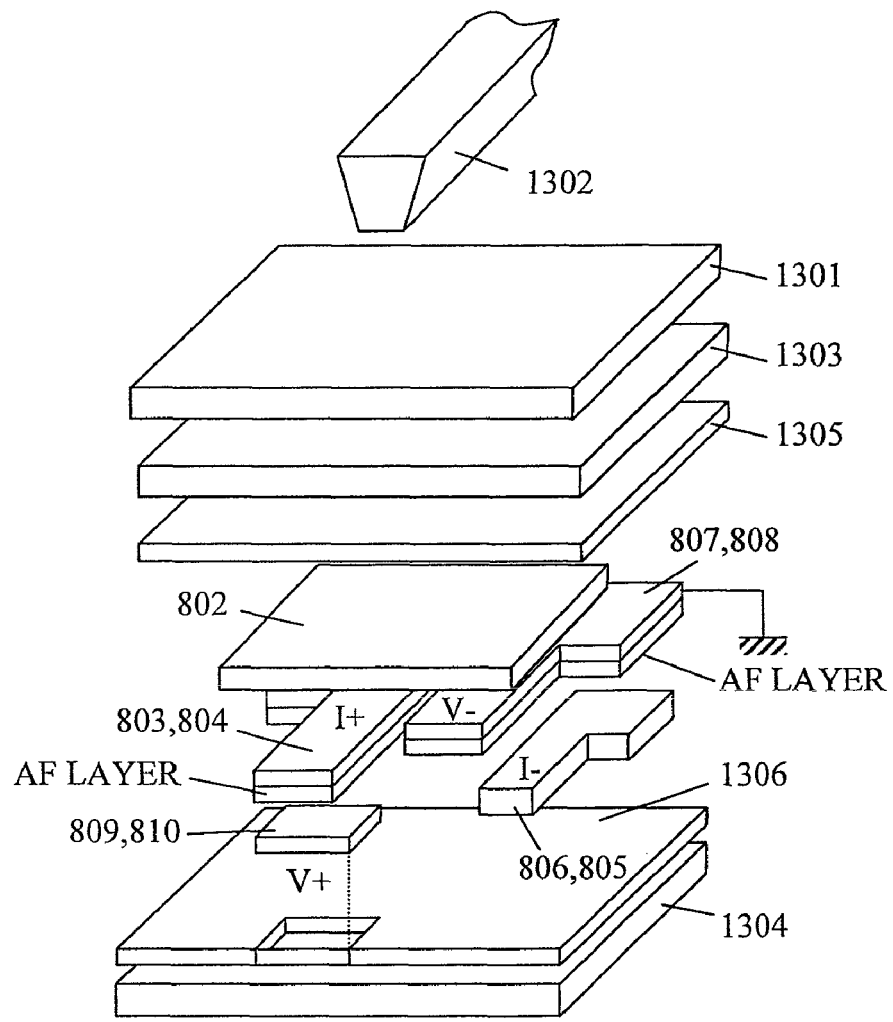
FIG. 14 is a view showing another structural example of the magnetic reading head according to the present invention.
Figure 14:
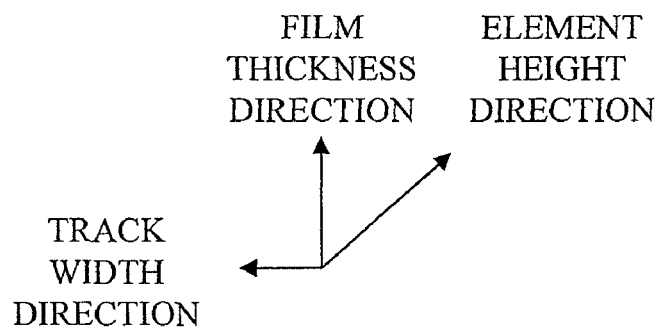

The film shown in FIG. 14 is similarly produced. The film in FIG. 14 shows a structure in which the magnetic layers and the Al film 802 are located in different positions from those shown in other drawings.

Figure 12:
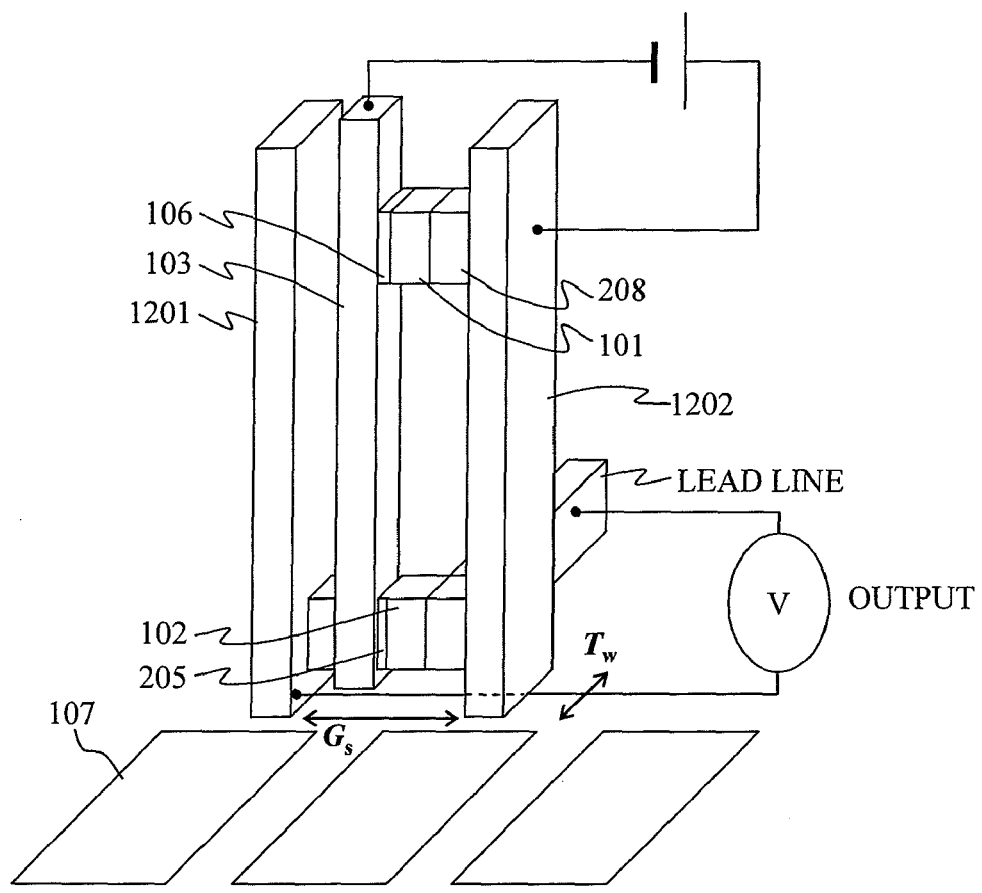
FIG. 12 is a view showing a structural example of a magnetic reading head according to the present invention.

FIG. 12 shows a configuration example of a reading head which is produced in accordance with the principle shown in FIG. 1. The reading head is structured in the following way. Specifically, the linear electrode layer 103 and the first magnetic body 101 are in contact with 106. Here, the linear electrode layer 103 is made of Cu, and has the width in a range from about 5 to 30 nm. The first magnetic body 101 is made of a magnetic material. The first insulating barrier layer 106 is made of $Al_2O_3$, and is formed on this electrode layer 103. Moreover, the second magnetic body 102 is in contact with the electrode layer 103 via the insulating barrier layer 205. Here, the second magnetic body 102 is made of CoFeB, and is located at a distance ranging from 10 to 1000 nm away from the electrode layer 103. A current source for supplying a current is connected to the first magnetic body 101 and the electrode layer 103 so that the current can flow thereon. Further, magnetic shields 1201 and 1202 made of soft magnetic films are disposed on upper and lower surfaces in the film thickness direction of bases of these elements through insulating films. The magnetic head is formed into a structure in which a recording head is located above this upper shield 1202.

In a case where the second magnetic body 102 has the area of 50 nm×50 nm, the electric potential difference V generated in a portion of the free layer 105 of this magneto-resistive sensor by the direction of magnetization is, in an experiment, equal to several millivolts at the time when the current 109 is set at 1.0 mA. Moreover, this voltage can be raised by increasing the current, selecting an appropriate material such as using the material, which has the high spin-polarization, for the magnetic film, or setting a low temperature, for example. In addition, it is possible to suppress noise generation at the time of supplying the current by using a material, which has the higher spin-polarization than that of the first magnetic body 101, for the second magnetic body 102 and for the insulating barrier layer 205, and thereby to improve the SNR.

This electric potential difference has a characteristic that the polarity is switched to a positive side and to a negative side.

FIG. 13 and FIG. 14 are views showing each of the layers of the element produced in accordance with the principle illustrated in FIG. 8. Here, the layers are shown as exploded, and as viewed from a plane opposite a medium. For example, the first electrode layers 802, 804, 806, 808 and 810 are in contact with the first to fourth insulative layers, and the first electrode layer 802 has a width of about 500 nm, and is made of a material such as Al. The first and second ferromagnetic electrode layers 804 and 805 are made of Co, and the third and fourth ferromagnetic electrode layers 808 and 810 are made of a Heusler alloy (CoFeCrAl) that exhibits high spin-polarization in the TMR. The first to fourth insulating barrier layers (803, 805, 807 and 809) are made of $Al_2O_3$. A contact portion between the ferromagnetic electrode layers and the first electrode layer has a side with a size in a range from about 5 to 50 nm. The fourth ferromagnetic electrode layer 810 is exposed on a surface opposite the medium, or is located in the closest position on the surface opposite the medium via a protective film. The third ferromagnetic electrode layer 808 is disposed in a position with a distance ranging from 50 to 500 nm away from the fourth ferromagnetic electrode layer 810 in the element height direction. The first ferromagnetic electrode layer 804 is located in a position between the fourth and third ferromagnetic electrode layers from the viewpoint of the element height direction, and substantially at the same distance from these two ferromagnetic electrode layers. The second ferromagnetic electrode layer 806 is located in a position substantially at the same element height as the first ferromagnetic electrode layer 804, and substantially at the same distance from the fourth and third ferromagnetic electrode layers.

The directions of magnetization of the respective first, second and third ferromagnetic electrode layers 804, 806 and 808 are fixed with the antiferromagnetic layers (the AF layers) superposed on the respective layers. The direction of magnetization of the fourth ferromagnetic electrode layer 810 changes in response to the external magnetic field. The current source for supplying the current is connected to the first ferromagnetic electrode layer 804 and the second ferromagnetic electrode layer 806 so that the current is applied to the first electrode layer. The third ferromagnetic electrode layer 808 is electrically grounded, and is connected to the mechanism for measuring the voltage change caused by the magnetization reversal of the fourth ferromagnetic electrode layer 810. Furthermore, magnetic shields 1304 and 1303 made of soft magnetic films are disposed on the lower layers constituting the base of the element, and on a surface side of the film via insulating films 1305 and 1306. The magnetic head is formed into the structure in which a recording magnetic pole 1302 is located above the upper shield 1303 via an insulating film 1301.

In a case where the first ferromagnetic electrode film 804 has the area of 500 nm×500 nm, the electric potential difference V generated between the fourth and third ferromagnetic electrode layers 810 and 808 by the direction of magnetization becomes approximately equal to or above 100 mV at room temperature at the time when the current flowing between the first and second ferromagnetic electrode layers 804 and 806 is set at 100 μA. Here, the potential difference V is approximately ten times as large as an output confirmed in a case of using a non-magnetic strip, and is twice more as large as a value obtained in a case where the four ferromagnetic electrode layers 804, 806, 808 and 810 in a similar structure are made of the same material. Moreover, this voltage is equal to an extremely low value when the external magnetic field to be applied to the element is equal to zero and therefore shows a high value in a range from 100% to 1000% as a rate of change due to the external magnetic field. The output and the change rate can be increased by reducing the area of the first electrode film, increasing the current, selecting an appropriate material such as using the material, which has the high spin-polarization, for the ferromagnetic electrode, or setting a low temperature, for example.

A similar effect is obtained by an element structure as shown in FIG. 14. For example, suppose that the first and second ferromagnetic electrode layers 804 and 806 made of Co and the third and fourth ferromagnetic electrode layers 808 and 810 are in contact with the first to fourth insulating barrier layers (803, 805, 807 and 809) made of crystallized MgO. In this case, the electric potential difference V generated between the fourth and third ferromagnetic electrode layers 810 and 808 is approximately equal to or above 150 mV at room temperature at the time when the current flowing between the first and second ferromagnetic electrode layers 804 and 806 is set at 100 μA. Here, the electric potential difference V is approximately ten times as large as the output confirmed in the case of using the non-magnetic strip, and is twice or more as large as the value obtained in a case where the four ferromagnetic electrode layers 804, 806, 808 and 810 in a similar structure are made of the same material. This is attributable to the fact that the size of the signal is increased, and that a loss by the noises is reduced by optimizing the spin-polarization.

In a case of forming a half-metal magnetic film as the magnetic film constituting the ferromagnetic electrode layer, it is possible to produce a $Fe_3O_4$ film having saturated magnification equal to or above 0.4 Tesla for a film with a film thickness equal to or below 50 nm at a substrate temperature equal to or above 250° C. This film is produced with a novel method of forming a film at a low rate and low energy while reducing a $H_2O$ fraction of an atmosphere in a sputtering chamber. A half-metallic property of this $Fe_3O_4$ film has been confirmed by theory testing based on first-principle calculation and by spectral analyses in the past. The saturation magnetization Bs of the formed $Fe_3O_4$ film is equal to or above 0.4 Tesla by setting surface roughness Ra of a foundation layer equal to or below 0.4 nm irrespective of whether the foundation layer is made of conductive metal or metal alloy such as Pt, Cu, Pd, Rh, Ru, Ir, Au, Ag, Ta, CoFe, Co or NiFe, or a conductive compound film such as TiN. In this way, substantially favorable $Fe_3O_4$ growth is confirmed. Moreover, by inserting an appropriate foundation film, such as Cr, Ta or NiFeCr, below the above-mentioned rare metal by a thickness ranging from several nanometers to several tens of nanometers, it is possible to smooth a surface structure of the rare-metal film deposited thereon, and thereby to promote the growth of the $Fe_3O_4$ film.

Concerning an oxide half-metal material such as $CrO_2$, ZnO or GaN other than $Fe_3O_4$, deposition of a single-layer film is confirmed at the substrate temperature equal to 250° C. by forming the foundation rare-metal layer, and then by causing the oxide half-metal film thereon to grow, as similar to the above-described case using $Fe_3O_4$. It is possible to turn ZnO into a ferromagnetic half-metal state by doping 25% of ferromagnetic metal such as V, Cr, Fe, Co or Ni. It is also possible to turn GaN into the ferromagnetic half metal by doping 25% of Mn on a GaAs foundation film by use of the MBE.

Among compounds called Heusler alloys, $CO_2MnGe$, $CO_2MnSb$, $CO_2Cr_{0.6}Al_{0.4}Mn$, and the like, can be produced by a method of directly growing a film on a substrate by RF sputtering in an Ar atmosphere while using targets corresponding to the composition of the film. It is preferable to set the substrate temperature equal to or above 300° C., and to add a thermal treatment equal to or above 700° C. However, it is also possible to obtain an ordered structure by forming the film on the substrate at room temperature, and then by performing a thermal treatment for an extended period of time at 27° C. Here, since a relationship between the composition of the produced film and the compositions of the targets is easily deviated, it is necessary to identify the composition of the produced film by means of x-ray photoelectron spectroscopy (XPS) or an inductively coupled plasma (ICP) analysis.

By using these films for magnetic layers, the output ΔV of the magneto-resistive element is increased by several times, and this is therefore effective in simplifying element designing.

Descriptions will be provided for another embodiment in which CoFeB is used for the magnetic body constituting the ferromagnetic electrode layer in the element structure shown in FIG. 1, and in the element structure shown in FIG. 8. The film is produced by use of an ultrahigh-vacuum sputtering film-forming method which uses Ar gas while setting the substrate temperature at room temperature. The composition ratio of CoFe to B is set in a range from 6:4 to 8:2, while the composition ratio of Co to Fe is set in a range from 1:1 to 3:1. At this time, the crystal structure of the film produced at room temperature is amorphous. In addition, a CoFe—X type compound such as CoFeC or CoFeN is also formed into an amorphous structure at a similar composition ratio. Then, the MgO film is formed on this film. A MgO target is used for forming the films, and the ultrahigh-vacuum sputtering film-forming method using Ar gas is adopted as similar to the foregoing example. The thickness of the MgO film is set in a range from 0.6 to 2.5 nm. The MgO insulating film formed on this amorphous film is aligned in the (100) orientation. A CoFeB film is formed similarly on this film, and an antiferromagnetic film or the like is further formed thereon. An element having the area of 1 μm×1 μm is produced therefrom, and then the magneto-resistive change is measured. The element shows a TMR value around 100% at room temperature. Furthermore, a film having a TMR value equal to or above 250% is obtained by subjecting this element to a thermal treatment at a temperature in a range from 300° C. to 400° C. inclusive. The temperature above 400° C. causes destruction of other films.

Figure 15:
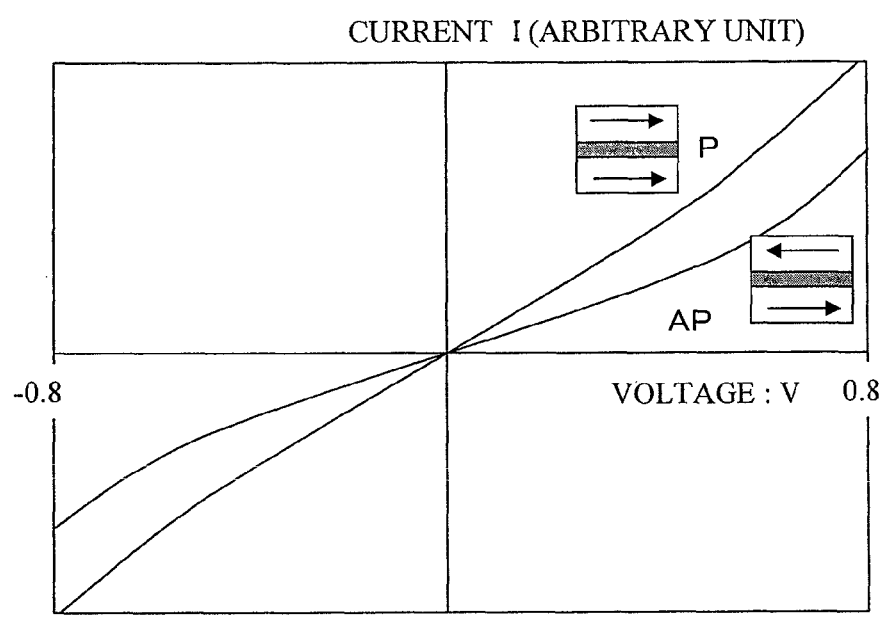
FIG. 15 is a graph showing current-voltage characteristics of TMR using a MgO insulating barrier layer.

The magnetic layers and the insulating barrier layers of the element, which has been thermal-treated at the temperature in the range from 300° C. to 400° C. inclusive, are crystallized. This state can be confirmed by checking a cross-sectional transmission electron microscopic (TEM) photograph of the layers. As shown in FIG. 15, this element has a characteristic that a current-to-voltage property changes between magnetization in a parallel state and magnetization in a anti-parallel state. In this case, the barrier is effective in an antiferromagnetic state, and the barrier level is in a range from 0.2 to 0.5 eV. This value is about half as much as the barrier level (0.8 to 1.4 eV) of aluminum oxide. Moreover, this element exhibits a substantially straight. I-V property in the parallel state, and behaves as substantially metal. Accordingly, it is conceivable that no or very little shot noise is generated by electron transmission through the barrier in this condition. Thus, it is very effective to use the MgO, CoFeB and other related groups to this element in addition to the use of the aforementioned positional layouts of the electrodes for noise reduction.

As for the magnetic material of the free layer which is to be combined with the insulating barrier layer made of a designated insulating barrier layer material other than MgO, it is preferable to use the numerous magnetic materials which have been previously known to possess large half-metal effects, instead of CoFeB. In this case, it is preferable to apply a single film or a laminated film containing at least one of $Al_2O_3$, AlN, $SiO_2$, $HfO_2$, $Zr_2O_3$, $Cr_2O_3$, MgO, $TiO_2$ and $SrTiO_3$ as the material for forming the insulating barrier layer. In particular, as described previously, crystalline MgO or crystalline $SrTiO_3$ is used for the portion constituting the free layer depending on the magnetic layer to be together used. For example, in a case of using $SrTiO_3$, the barrier level is in a range from 0.05 to 0.1 eV.

Figure 16:
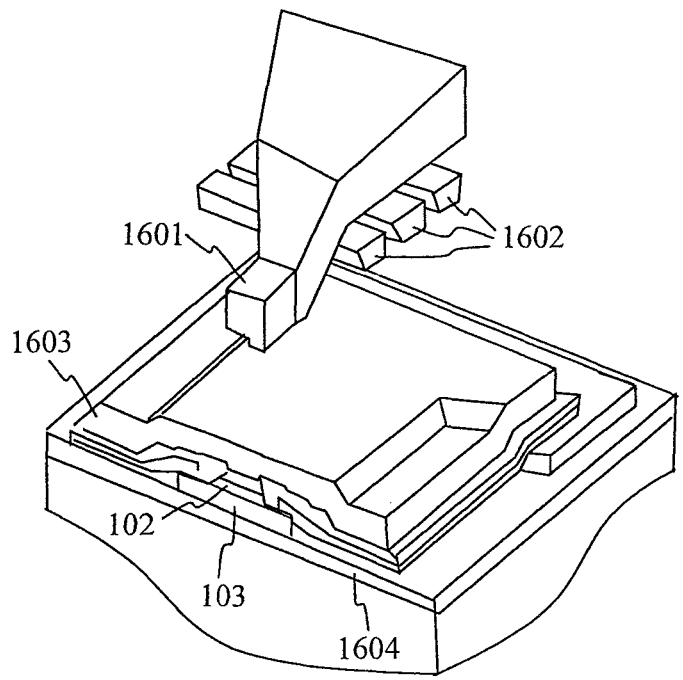
FIG. 16 is a schematic diagram showing a positional relationship between a recording head and the magneto-resistive element, to which the present invention is applied.

FIG. 16 is a schematic diagram showing a structure of a magnetic head including a recording head in addition to the reading head. The above-described structure of the reading head is formed between upper and lower shields 1603 and 1604, and the magnetic film 102 and the electrode layer 103 that constitute the basic structure are exposed on an ABS surface opposite a medium. A recording magnetic pole 1601 and coils 1602 for inducing magnetization of the recording magnetic pole 1601 are formed in the thickness direction of the element. A CoFe-type material having high saturation magnetic flux density can be used for the magnetic pole 1601, for example. Moreover, the reading head of the present invention is also effective when combined with a recording head provided with a mechanism for inverting magnetization by utilizing an action of reduction in magnetization associated with a temperature rise of the medium in accordance with a recording method of irradiating light in a reduced size so as to raise the temperature of the medium locally.

Figure 17:
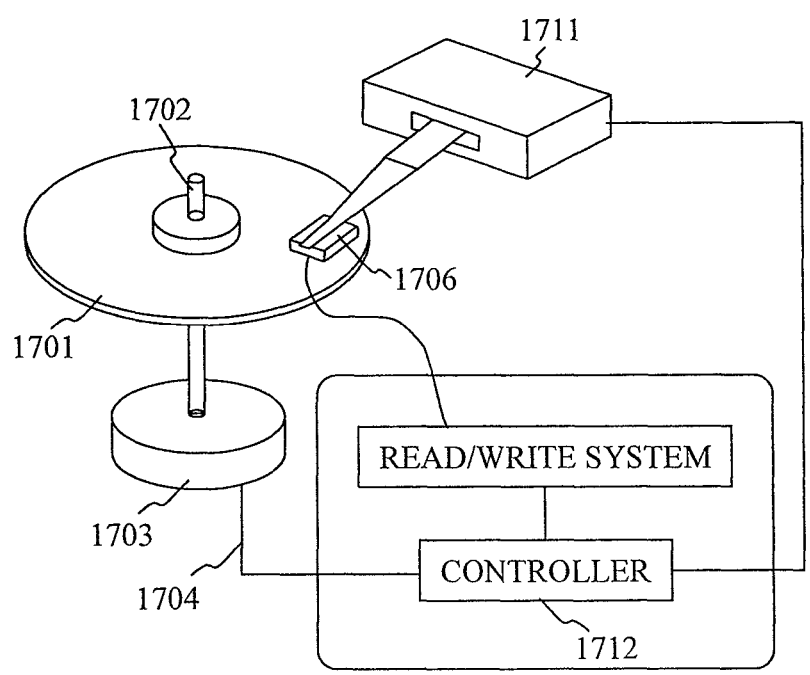
FIG. 17 is a schematic diagram of a magnetic recording apparatus to which the present invention is applied.

FIG. 17 is schematic diagram showing a configuration example of a magnetic disc apparatus including the magnetic head according to the present invention. A discoid magnetic disc 1701 which records data in concentric recording regions called tracks is supported by a rotating shaft 1702, and is rotated by a drive motor 1703. A slider 1706 loading the magnetic head of the present invention is placed above the magnetic disc 1701, and the magnetic head is caused to access a predetermined position where target data are recorded, by use of actuator means 1711 controlled by a controller 1712. Air bearing due to an air flow between the slider 1706 and a surface of the magnetic disc 1701 is generated by rotation of the magnetic disc 1701, and this causes the slider 1706 to float off the surface of the magnetic disc 1701. Accordingly, when the magnetic disc apparatus is in operation, the slider 1706 is maintained flowing without contacting the surface of the magnetic disc while retaining a constant clearance with the magnetic disc 1701.

Normally, the controller 1712 includes a logic circuit, a memory, a microprocessor and the like. The controller 1712 transmits and receives control signals through certain lines, and thereby controls various constituents of the magnetic disc apparatus. A read/write system reads information out of a readout signal obtained from the reading head, and transmits writing signals to the recording head. By mounting the magneto-resistive effect element of the present invention on this magnetic recording apparatus, it is possible to achieve magnetic recording and reading at reading density exceeding 500 $Gb/in^2$.

What is claimed is:

1. A magnetic reading head comprising:
a conductive layer;
a first element unit, which is formed by superposing a ferromagnetic layer on the conductive layer with an insulating barrier layer interposed in between, and in which the conductive layer and the ferromagnetic layer constitute part of a current-supplying circuit; and
a second element unit, which is formed by superposing a ferromagnetic layer on the conductive layer with an insulating barrier layer interposed in between, and in which the conductive layer and the ferromagnetic layer constitute part of a voltage-measurement circuit,
wherein spin-polarization at an interface of a junction between the ferromagnetic layer and the insulating barrier layer of the second element unit is greater than spin-polarization at an interface of a junction between the ferromagnetic layer and the insulating barrier layer of the first element unit,
wherein a film for fixing magnetization of the ferromagnetic layer of the first element unit is formed on a surface of the ferromagnetic layer, which surface is located on a side opposite a surface which is in contact with the insulating barrier layer,
wherein the insulating barrier layer of the second element unit is crystalline, and
wherein a principal crystal structure of the ferromagnetic layer of the second element unit, in volumetric terms, is in any one of a face-centered cubic lattice, an amorphous structure and a mixed state of the face-centered cubic lattice and the amorphous state.

2. The magnetic reading head according to claim 1, wherein a film for fixing magnetization of the ferromagnetic layer of the first element unit is formed on a surface of the ferromagnetic layer, which surface is located on a side opposite a surface which is in contact with the insulating barrier layer.

3. The magnetic reading head according to claim 1, wherein a material constituting the insulating barrier layer of the second element unit is made of at least one substance selected from the group consisting of MgO, ZnO, $TiO_2$, $Al_2O_3$, $SrTiO_3$.

4. The magnetic reading head according to claim 1, wherein a material constituting the ferromagnetic layer of the second element is made of any one of pure Fe, an oxide of Fe and a Fe—Co-containing compound also containing at least one of B, C and N.

* * * * *